United States Patent [19]
Kase

[11] Patent Number: 5,905,453
[45] Date of Patent: May 18, 1999

[54] DITHERED SIGMA DELTA MODULATOR HAVING PROGRAMMABLE FULL SCALE RANGE ADJUSTMENT

[75] Inventor: Kiyoshi Kase, Pflugerville, Tex.

[73] Assignee: Motorola, Inc., Schaumburg, Ill.

[21] Appl. No.: 08/905,700

[22] Filed: Aug. 4, 1997

[51] Int. Cl.⁶ .................................................. H03M 3/02
[52] U.S. Cl. .......................................... 341/143; 341/131
[58] Field of Search ..................................... 341/131, 143, 341/139

[56] References Cited

U.S. PATENT DOCUMENTS

| | | | |
|---|---|---|---|
| 4,857,927 | 8/1989 | Takabayashi | 341/131 |
| 4,968,987 | 11/1990 | Naka et al. | 341/143 |
| 5,010,347 | 4/1991 | Yukawa | 341/143 |
| 5,073,777 | 12/1991 | Fukuhara et al. | 341/131 |
| 5,144,308 | 9/1992 | Norsworthy | 341/131 |
| 5,187,481 | 2/1993 | Hiller | 341/131 |
| 5,416,481 | 5/1995 | Chen | 341/131 |
| 5,483,238 | 1/1996 | Norsworthy | 341/131 |
| 5,493,298 | 2/1996 | Bartz | 341/131 |
| 5,497,154 | 3/1996 | Komamura | 341/131 |
| 5,530,442 | 6/1996 | Norsworthy et al. | 341/131 |

*Primary Examiner*—Marc S. Hoff
*Attorney, Agent, or Firm*—Bruce Hayden; Jeffrey G. Toler

[57] ABSTRACT

A sigma delta modulator (10) for use in codec applications provides dynamic range adjustment and avoids asymmetrical signal clipping. The modulator (10) has a summing circuit that sums a plurality of inputs, one of which is a dither component. The dither is programmably modifiable to provide enhanced performance. The dither is provided by a pseudo random number generator (100). The pseudo random number generator (100) has an n-bit shift register (106) coupled to a last code detect (108) to detect the end of a pseudo random number sequence. At that time, a new preset code can be loaded (110) into the shift register (106) to provide different dither characteristics. This allows the pseudo random number generator (100) to programmably determine the percentage of ones and zeros to add to the output signal. The dither output can be inverted (104) to shift the dither up or down.

18 Claims, 5 Drawing Sheets

| DIVISION | PRESET VALUE | RESIDUAL DC (%) |
|---|---|---|
| 128 | 126 | 0 |
| 100 | 69 | 10 |
| 60 | 99 | 20 |
| 30 | 59 | 40 |
| 27 | 88 | 48 |
| 25 | 97 | 60 |

5,905,453

DITHERED SIGMA DELTA MODULATOR HAVING PROGRAMMABLE FULL SCALE RANGE ADJUSTMENT

FIELD OF THE INVENTION

The present invention generally relates to analog-to-digital (A/D) converters (ADC) and more specifically to an improvement to dithering in an ADC to improve curve fitting.

BACKGROUND OF THE INVENTION

This invention concerns a sigma delta modulator for use in a voice codec application used to convert analog voice signals to digital signals such as those used with GSM.

In quantizing operation in A/D conversion, partial missing of information in the quantized output signal is inevitable because continuously distributed sampled values in an input signal are expressed by dispersed values in the quantized output signal. This difference between the quantized output signals and the input sampled values becomes a quantizing noise which is an inherent restriction on the digital signal processing. The quantizing noise becomes a white noise which is uncorrelated with a signal to be converted if the signal is of a large level whereas the quantizing noise becomes distortion which is greatly correlated with the signal if the signal is of a relatively small level and this noise adversely affects the quality of tone when a signal is sounded in digital apparati.

A dither circuit can be used to overcome this problem. The dither circuit is provided for uncorrelating quantizing noise with a signal to be converted by superimposing dither or random noise on an input signal before A/D conversion and subtracting the dither component after the A/D conversion.

Input range adjustment is strongly desired under low power supply operation since the signal swings must be limited to the range power supply and ground rail. Some of the problems inherent in the prior art include asymmetrical signal clipping and shifting in sigma delta modulator circuits.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION

This present invention is related to a sigma delta modulator with dithering circuit used in analog to digital converters and digital to analog converters. A sigma delta modulator technique is used for digitizing precision audio. Using this invention, sigma delta modulator technique can be applied to measure precision direct current (DC) and can be used under low voltage operation with high degree of accuracy.

A dither circuit is useful for improving linearity in Analog-to-Digital converter (A/D) or Digital-to-Analog converter (D/A). The noise spectrum of a dither signal is normally generated by a digital noise shaping circuit which has known multiple spectrum output or widely spread outbound spectrum noises such as pseudo random binary sequencer shown in FIG. 3. By using conventional sigma delta modulator (called SDM) and the dithering pattern generation circuit, fully calibrated dynamic range can be achieved by adding the proper residual DC component onto the dithering noises. This input range adjustment is strongly desired under low power supply operation since the signal swings must be limited to the range power supply and ground rail. This invention can avoid any asymmetrical signal clipping.

Figure 1:
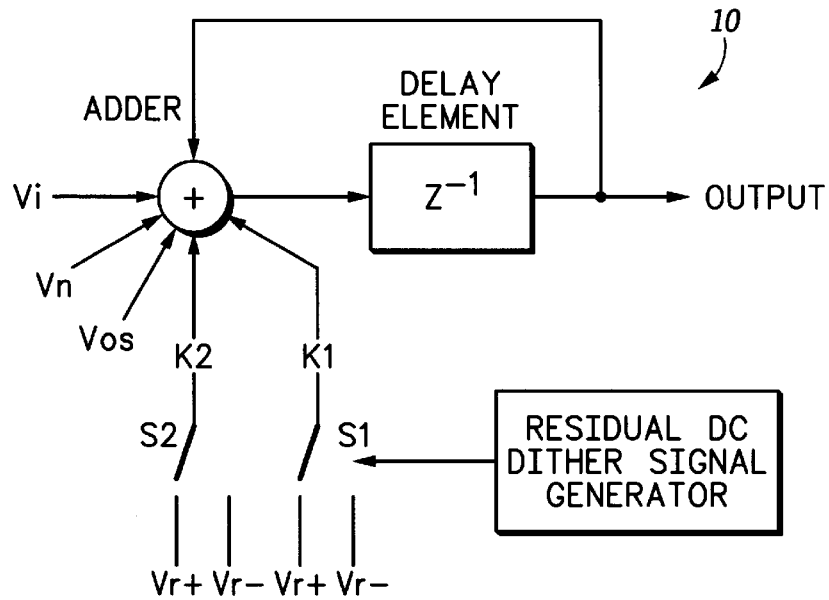
FIG. 1 is a block diagram illustrating a sigma delta modulator that includes a residual DC dither signal generator component, in accordance with the present invention.

FIG. 1 is a block diagram illustrating a sigma delta modulator that includes a residual DC dither signal generator component. In FIG. 1, the theoretical input ($V_I$) range is defined by $K_2{*}V_R$. However, there are many noise sources in the real circuit such as DC offset voltage ($V_{OS}$) and switching noises ($V_N$). The switching noise is folded back to DC due to the sampling processing and generates alias components. Thus, the actual input range is shifted by $V_N$ and $V_{OS}$, which are called "systematic offset". The dither circuit adds a known noise into the Adder (1), then it later subtracts the noise from the output. If a dither signal with residual DC components is supplied to switch $S_1$, the dither product can cancel the effects of $V_{OS}$ and $V_N$ in the Adder. Higher order sigma delta modulators can be achieved by cascading the first order sigma delta modulator shown in FIG. 1. Switch $S_1$ is alternated depending upon the logic state from the Residual DC dither pattern generator. Switch $S_2$ is alternated by the external signal normally fed back from the output of the second sigma delta modulator.

Figure 2:
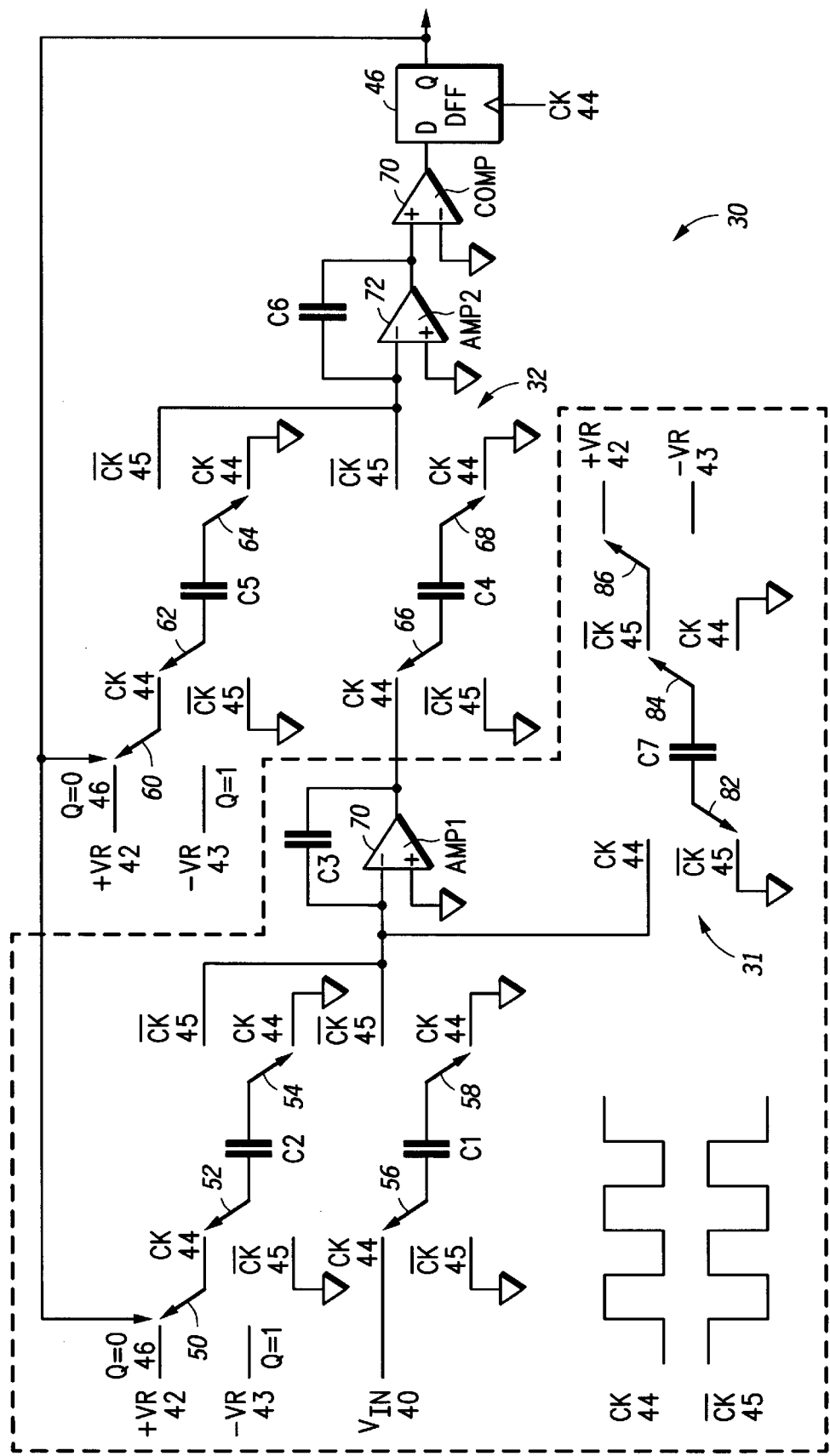
FIG. 2 is a circuit diagram illustrating a second order sigma delta modulator, in accordance with the present invention;.

FIG. 2 is a circuit diagram illustrating a second order sigma delta modulator. The sigma delta modulator 30 has two stages: a first stage 31, and a second stage 32. In the first stage 31, a switch 50 has a first input connected to $+V_R$ 42, a second input connected to $-V_R$ 43, and an output. Switch 50 is controlled by signal Q 46 wherein the first input is connected when Q 46=0 and the second input is connected when Q 46=1. Switch 52 has a first input connected to the output of switch 50, a second input connected to ground, and an output. Switch 52 is controlled by clock (CK) wherein the first input is connected when CLK 44 is asserted, while the second input is connected when $\overline{\text{CLK}}$ 45 is asserted. Note that hereinafter "CK" and "CLK" will be used interchangeably to indicate the same clock signals. The output of switch 52 is connected to one of two terminals to capacitor C2. Switch 54 has a first input, a second input connected to ground, and an output connected to the second of the two terminals to capacitor C2. Switch 54 is controlled by clock (CK) wherein the first input is connected when $\overline{\text{CLK}}$ 45 is asserted, while the second input is connected when CLK 44 is asserted. Switch 56 has a first input connected to $V_{IN}$ 40, a second input connected to ground, and an output. Switch 56 is controlled by clock (CK) wherein the first input is connected when CLK 44 is asserted, while the second input is connected when $\overline{CLK}$ 45 is asserted. The output from switch 56 is connected to one of two terminals of capacitor C1. Switch 58 has a first input, a second input, and an output connected to the second of the two terminals to capacitor C1. Switch 58 has a first input, a second input coupled to ground, and an output. Switch 58 is controlled by clock (CK) wherein the first input is connected when $\overline{CLK}$ 45 is asserted, while the second input is connected when CLK 44 is asserted.

OP amp 70 has an inverting (−) input, a non-inverting (+) input, and an output. The first input from switch 54 is connected to the first input from switch 58 and to the inverting (−) input to OP amp 70. The non-inverting (+) input for OP amp 70 is connected to ground. Connected between the inverting (−) input and the output of OP amp 70 is capacitor C3, forming an integrator. Switch 82 has a first input connected to the inverting input of OP amp 70, a second input connected to ground, and an output. Switch 82 is controlled by clock (CK) wherein the first input is connected when CLK 44 is asserted, while the second input is connected when $\overline{CLK}$ 45 is asserted. The output from switch 82 is connected to a one of two terminals of capacitors C7. Switch 84 has a first input, a second input connected to ground, and an output connected to the second of the two terminals of capacitor C7. Switch 84 is controlled by clock (CK) wherein the first input is connected when $\overline{CLK}$ 45 is asserted, while the second input is connected when CLK 44 is asserted. The first input from switch 84 is connected to an output from switch 86. Switch 86 has a first input connected to $+V_R$ 42, a second input connected to $-V_R$ 45, and an output. Switch 86 is connected to its first input when a dither signal 48 is asserted, and is connected to its second input when the dither signal 48 is negated.

The output from the first stage 31 is the output from OP amp 70. Switch 66 has a first input connected to the output from OP amp 70, a second input connected to ground, and an output. Switch 66 is controlled by clock (CK) wherein the first input is connected when CLK 44 is asserted, while the second input is connected when $\overline{CLK}$ 45 is asserted. The output from switch 66 is connected to one of two terminals of capacitor C4. Switch 68 has a first input, a second input connected to ground, and an output connected to the second of the two terminals of capacitor C4. Switch 68 is controlled by clock (CK) wherein the first input is connected when $\overline{CLK}$ 45 is asserted, while the second input is connected when CLK 44 is asserted.

OP amp 72 has an inverting (−) input connected to the first input to switch 68, a non-inverting (+) input connected to ground, and an output. A capacitor C6 is connected between the inverting (−) input and the output of OP amp 72, forming again an integrator. Switch 60 has a first input connected to $+V_R$ 42, a second input connected to $-V_R$ 43, and an output. Switch 60 is connected to its first input when Q 46=0 and is connected to its second input when Q 46=1. Switch 62 has a first input connected to the output of switch 60, a second input connected to ground, and an output connected to one of two terminals of a capacitor C5. Switch 62 is controlled by clock (CK) wherein the first input is connected when CLK 44 is asserted, while the second input is connected when $\overline{CLK}$ 45 is asserted. Switch 64 has a first input connected to the inverting (−) input of OP amp 72, a second input connected to ground, and an output connected to the second terminal of capacitor C5. Switch 64 is controlled by clock (CK) wherein the first input is connected when $\overline{CLK}$ 45 is asserted, while the second input is connected when CLK 44 is asserted. OP amp 74 has an inverting (−) input, a non-inverting (+) input, and an output. The output of OP amp 72 is connected to the inverting (−) input of OP amp 74, while its non-inverting (+) input is connected to ground, forming a comparitor for comparing its inverting (−) input to its non-inverting (+) input. Flip-flop 76 has an input D connected to the output from comparitor OP amp 74, an output Q 46, and is controlled by the clock (CK) 44.

Figure 3:
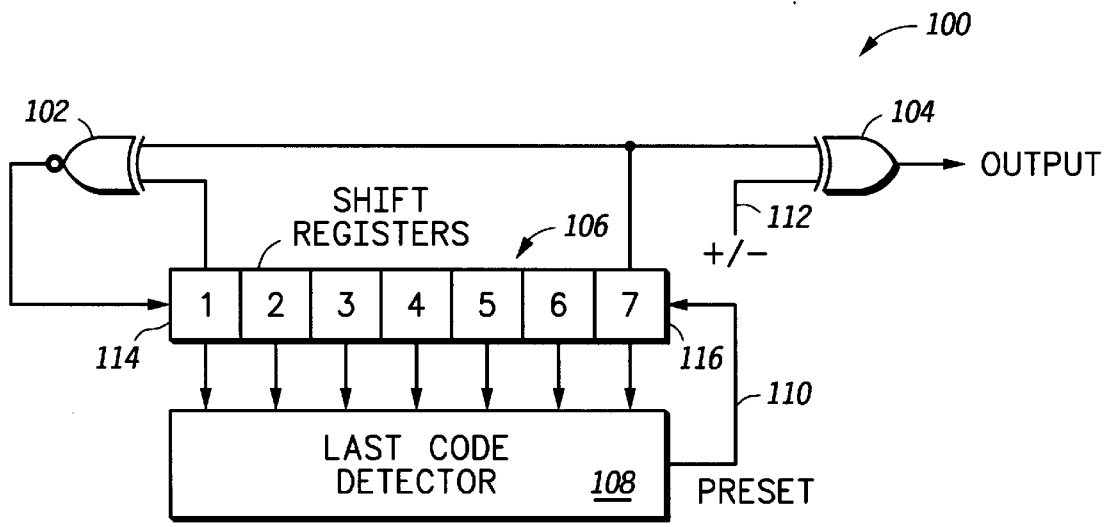
FIG. 3 is a block diagram illustrating one example of such a binary bit stream pattern generation, in accordance with the present invention.
Figures 4, 5:
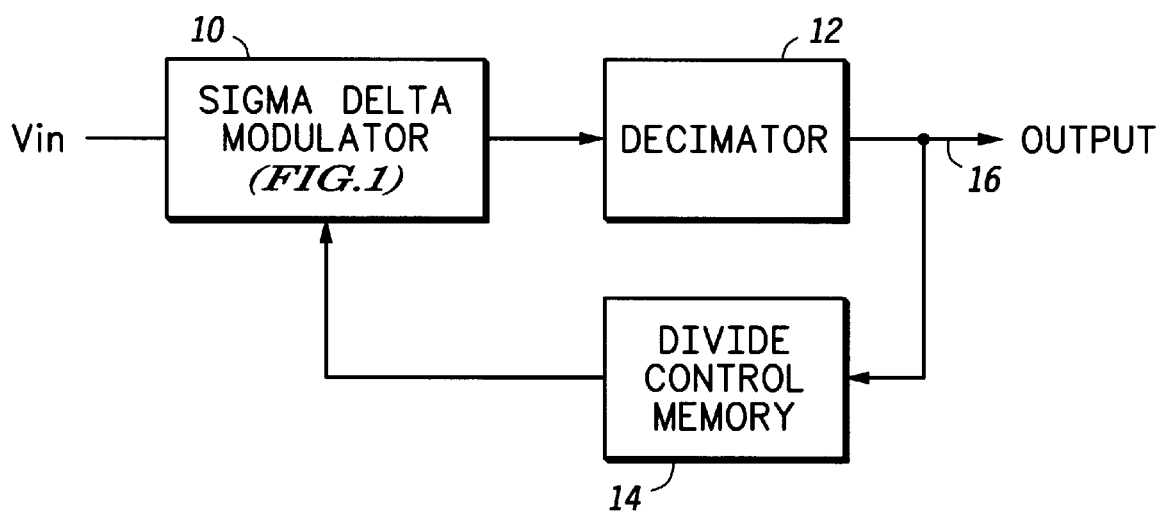
FIG. 4 is a table illustrating an experimental case using the logic circuit shown in FIG. 3.
FIG. 5 is a block diagram that illustrates one example of calibrating using adaptive segmented correction, in accordance with the present invention.

One key issue is how to generate known spectrum noise which has controlled DC residual with desired noise spectrum. FIG. 3 is a block diagram illustrating one example of such a binary bit stream pattern generation. Proper programming input code can be chosen by using predetermined or simulated data. FIG. 4 is a table illustrating an experimental case using the logic circuit shown in FIG. 3. Three columns are shown in the table: Division, which is a number of cycles of before the pseudo random number generator repeats; Preset Value, which is the value loaded into the shift register at receipt of a preset signal; and Residual DC(%), which is an average of the bitstream in the pseudo random sequence that are zero as compared to one. This value is computed by subtracting the percentage of expected zero bits from the percentage of expected one bits in the pseudo random sequence. For example, when the residual DC value is 0%, the difference is zero, and thus both one bits and zero bits have an equal expectation. On the other hand, in the case of a residual DC value equal to 60%, the expectation is that 80% of the bits in the pseudo random sequence will be one bits, while 20% of the bits in the sequence will be zero bits. The table can be used to select a Preset Value that generates a given residual DC offset value. Note that the table in FIG. 4 is illustrative only, and that in a preferred embodiment, the table includes 127 entries, having division values ranging from 1–128.

This logic circuit 100 is composed as a 7-bit width pseudo binary sequencer which was implemented by a 7 bit shift register 106 and exclusive-NOR 102 feedback loop with the left most 114 and right most bit locations 116. The preset data 110 is loaded from the table shown in FIG. 4 when the "last code" is detected by the last code detector 108. In this case, the residual DC is always positive. Therefore, an output polarity select (XOR) gate 104 is needed to obtain negative values. This is accomplished by providing a polarity select signal 112 to the output polarity select XOR gate 104. The residual DC component (see table in FIG. 4) can be selected by $1/2^N$ step, where "N" is the length of the shift register. A 1% adjustment step can be achieved when 7-bit width architecture is used. This adjustment method is much easier in operation than changing $K_1$, $K_2$, $+V_R$, or $-V_R$ variables in the analog portion of the sigma delta modulator circuit shown in FIG. 1. This is because $K_1$ and $K_2$ are normally defined by ratios of capacitors in a switched capacitor sigma delta modulator implementation. Such ratio adjustments are not easy because real analog circuits have many elements and parasitics. $+V_R$ and/or $-V_R$ are normally generated by a band-gap voltage reference source which have voltage and temperature coefficients that are difficult to trim at the same time, especially in real-time.

FIG. 5 is a block diagram that illustrates one example of calibrating using adaptive segmented correction. A part of the most significant bits can be fed to the divide control memory 14. The memory sends a proper program value which generates desired residual DC to the sigma delta modulator 10. Decimator 12 and Divide Control Memory 14 can be achieved by any logic including a software solution.

Figure 6:
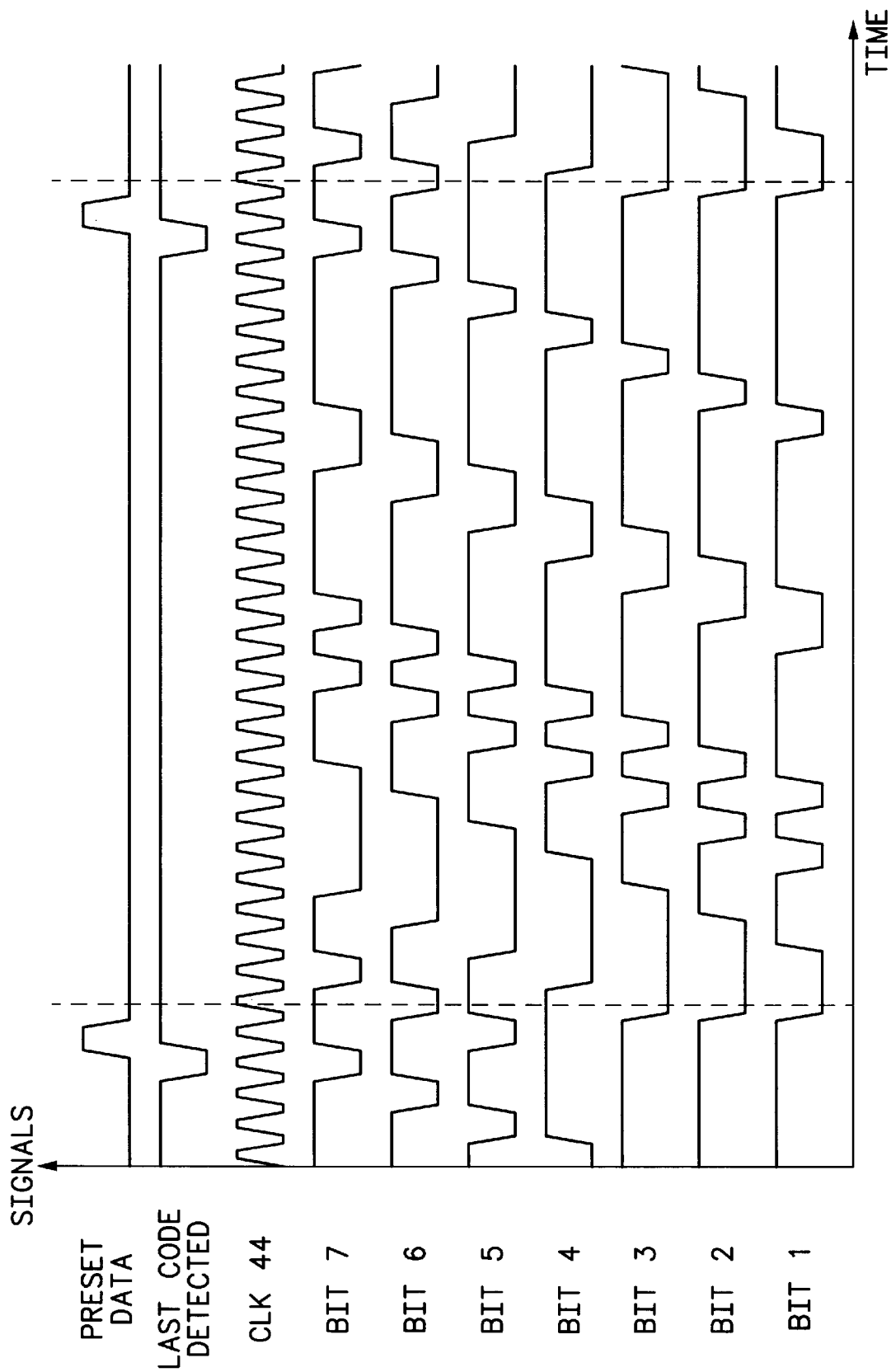
FIG. 6 is a timing chart illustrating a sample operation of a 7-bit pseudo random binary sequencer, in accordance with the present invention.

FIG. 6 is a timing chart illustrating a sample operation of a 7-bit pseudo random binary sequencer. Shown in the timing chart are the values for bits 1 through 7, the clock (CK), a last code detected signal, and the preset data. First note the pattern shifting through bits 1 through 7. This is a result of the previously loaded preset value initializing the pseudo random number generator. The last code detected signal is asserted (low) when the last code detection circuit 108 detects the last code sequence in the shift registers 106. It in turn triggers loading the preset data 110 into the shift registers 106.

Figure 7:
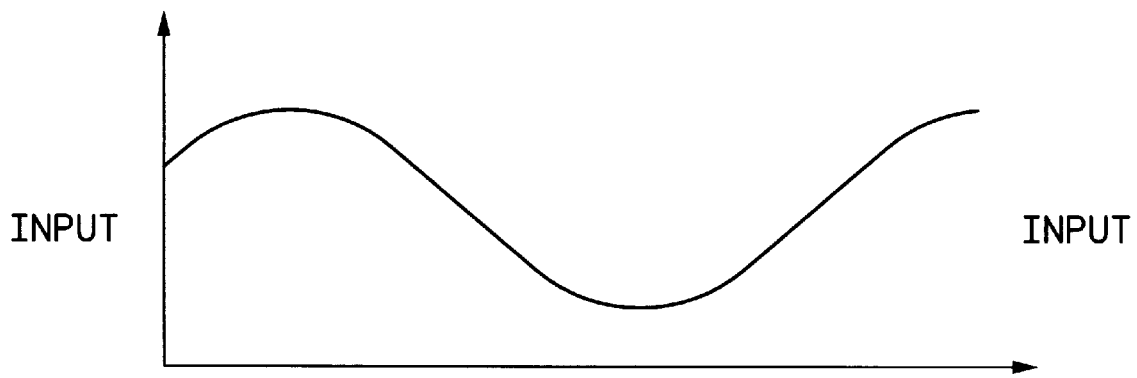
FIGS. 7 and 8 are timing charts respectively illustrating the input and output waveforms from the disclosed second order sigma delta modulator with residual DC shift, in accordance with the present invention.
Figure 8:
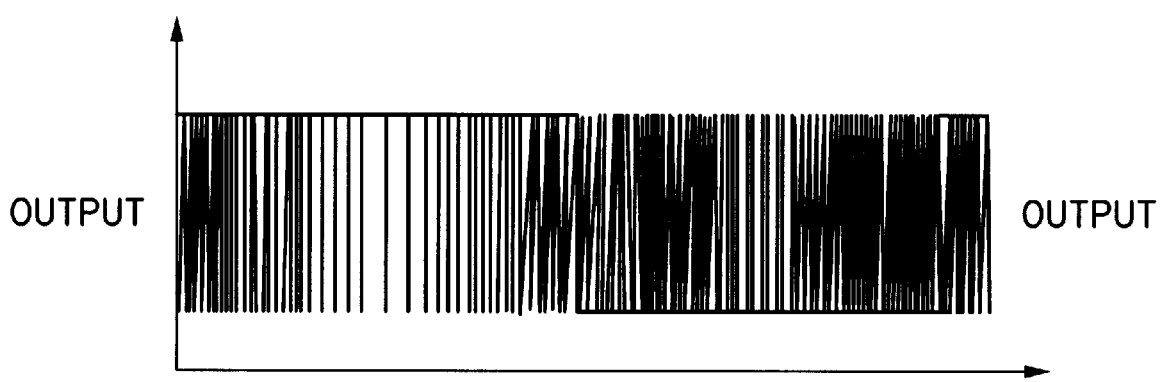

FIG. 7 is a timing chart illustrating the input and output waveforms from the disclosed second order sigma delta modulator with residual DC shift. The input waveform is sinusoidal. The output is generated from the sinusoidal input waveform. It consists of ones (high) and zeros (low) that represent the input signal. Note that the output that corresponds to the top of the sinusoidal input waveform contains more one bits than the output that corresponds to the low of the sinusoidal input waveform has zero bits. This is caused by the shifting done through the use of the pseudo random binary sequencer.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. A sigma delta modulator comprising:
    a summing circuit for summing a plurality of analog inputs; and
    a modified pseudo random binary sequence generator for generating a dither component that is coupled to and provides one of the plurality of analog inputs to the summing circuit;
    wherein the modified pseudo random binary sequence generator comprises:
        a shift register comprising a sequenced plurality of bits with a first bit and a last bit, and an output polarity select circuit responsively coupled to an output from the last bit and polarity select signal.

2. The sigma delta modulator in claim 1 wherein:
    the output polarity select circuit has a polarity select input and a polarity select output;
    the output polarity select circuit comprises an XOR gate with a first XOR input, a second XOR input, and an XOR output,
    a first XOR input is the polarity select input,
    the second XOR input is responsively coupled to the polarity select signal, and
    the XOR output provides the polarity select output.

3. The sigma delta modulator in claim 1 wherein the modified pseudo random binary sequence generator further comprises:
    a last code detector receiving values as inputs from each of the sequenced plurality of bits in the shift register and providing a last code detected signal.

4. The sigma delta modulator in claim 3 wherein:
    a preset sequence is loaded into each of the sequenced plurality of bits in the shift register from a preset table entry in a preset value table upon receipt of the last code detected signal.

5. The sigma delta modulator in claim 4 wherein:
    the preset value table is a table containing (2**n)–1 preset entries, wherein n is a number of the sequenced plurality of bits in the shift register.

6. The sigma delta modulator in claim 1 wherein: the shift register contains seven shiftable bits.

7. The sigma delta modulator in claim 1 which further comprises:
    a delay element responsively coupled to the summing circuit and providing one of the plurality of analog inputs to the summing circuit.

8. The sigma delta modulator of claim 1, wherein the modified pseudo random binary sequence generator further comprises:
    an XNOR feedback loop comprising an XNOR gate with a first input connected to the output from the last bit, a second input connected to an output from the first bit, and an output that provides an input to the first bit.

9. The sigma delta modulator of claim 1, wherein the output from the last bit of the shift register is selectively inverted by the output polarity select circuit to produce the dither component.

10. A sigma delta modulator comprising:
    a summing circuit for summing a plurality of analog inputs;
    a delay element responsively coupled to the summing circuit and providing one of the plurality of analog inputs to the summing circuit; and
    a modified pseudo random binary sequence generator for generating a dither component that is coupled to and provides one of the plurality of analog inputs to the summing circuit, wherein:
        the modified pseudo random number generator comprises:
            a shift register comprising a sequenced plurality of bits with a first bit and a last bit and containing seven shiftable bits,
            an output polarity select circuit responsively coupled to an output from the last bit and a polarity select signal;
            an XNOR feedback loop comprising an XNOR gate with a first input connected to the output from the last bit, a second input connected to an output from the first bit, and an output that provides an input to the first bit, and
            a last code detector receiving values as inputs from each of the sequenced plurality of bits in the shift register and providing a last code detected signal,
        the output polarity select circuit has a polarity select input and a polarity select output;
        the output polarity select circuit comprises an XOR gate with a first XOR input, a second XOR input, and an XOR output,
        a first XOR input is the polarity select input,
        a second XOR input is responsively coupled to the polarity select signal,
        the XOR output provides the polarity select output, and
        a preset sequence is loaded into each of the sequenced plurality of bits in the shift register from a preset table entry in a preset value table upon receipt of the last code detected signal.

11. A method of converting an analog signal to a digital signal comprising:
    receiving the analog signal as an input signal;
    generating a dither signal that is programmably biasable; and adding a plurality of signals including the analog signal and the dither signal to generate the digital signal;

wherein the step of generating the dither signal comprises:

sequentially shifting a plurality of bits through a shift register comprising an ordered plurality of bits, with a first bit and a last bit;

loading a preset pattern into the ordered plurality of bits, and selectively inverting the dither signal based on a polarity select signal.

12. The method in claim 11 wherein:

the loading of a preset pattern is done from a specified preset table entry in a preset value table.

13. The method in claim 12 which further comprises:

selecting an entry in the preset value table as the specified preset table entry, and selecting whether to assert or negate the polarity select signal.

14. The method in claim 11 wherein the step of generating the dither signal further comprises:

providing a bit to shift into the first bit of the shift register as a shift register input bit based on outputs from two of the ordered plurality of bits comprising the shift register;

shifting the shift register input bit into the first bit of the shift register.

15. The method in claim 14 wherein:

the providing a bit to shift into the first bit comprises:

XNORing an output from the first bit of the shift register with an output from the last bit of the shift register.

16. The method in claim 11 which further comprises:

testing each of the ordered plurality of bits for a specific pattern in order to generate a last code detected signal;

loading a preset pattern into the shift register in response to the last code detected signal.

17. The method in claim 11 which further comprises:

delaying an output signal from the adding, and wherein:

an output from the delaying is one of the plurality of added signals.

18. A method of converting an analog signal to a digital signal comprising:

receiving the analog signal as an input signal;

generating a dither signal that is programmably biasable, comprising:

sequentially shifting a plurality of bits through a shift register comprising an ordered plurality of bits, with a first bit and a last bit, loading a preset pattern from a specified preset table entry in a preset value table into the ordered plurality of bits, selectively inverting the dither signal based on a polarity select signal selecting an entry in the preset table as the specified preset table entry, selecting whether to assert or negate the polarity select signal, testing each of the ordered plurality of bits for a specific pattern in order to generate a last code detected signal, and loading a preset pattern into the shift register in response to the last code detected signal; and adding a plurality of signals including the analog signal and the dither signal to generate the digital signal.

* * * * *